United States Patent [19]

Nakamura et al.

[11] 3,711,740

[45] Jan. 16, 1973

[54] RESPONSE TIME CONTROLLED LIGHT EMITTING DEVICES

[75] Inventors: Satoshi Nakamura, Hachioji; Junichi Umeda, Kodaira, both of Japan

[73] Assignee: Hitachi, Ltd, Tokyo, Japan

[22] Filed: Dec. 3, 1970

[21] Appl. No.: 94,767

[30] Foreign Application Priority Data

Dec. 5, 1969 Japan ................................44/97179

[52] U.S. Cl...............................315/246, 250/217 SS

[51] Int. Cl.............................................H05b 41/16

[58] Field of Search....313/108 D; 315/169 NV, 246; 250/217 SS; 332/3

[56] References Cited

UNITED STATES PATENTS

| | | | |
|---|---|---|---|
| 3,385,970 | 5/1968 | Coffin, Jr. et al | 250/217 S |
| 3,492,488 | 1/1970 | Goettelmann | 250/217 SS X |

FOREIGN PATENTS OR APPLICATIONS

| | | | |
|---|---|---|---|
| 1,022,307 | 3/1966 | Great Britain | 250/217 SS |

*Primary Examiner*—Palmer C. Demeo
*Attorney*—Craig, Antonelli, Stewart & Hill

[57] ABSTRACT

A light emitting diode capable of being arbitrarily controlled in its duration of light emission or delay time of light emission by having applied beforehand a voltage lower than the threshold voltage for light emission to the light emitting diode and by applying a driving input voltage thereto in superposing relationship to the previously applied voltage.

5 Claims, 6 Drawing Figures

PRIOR ART

INVENTORS
SATOSHI NAKAMURA
JUNICHI UMEDA
BY Craig, Antonelli, Stewart & Hill
ATTORNEYS

RESPONSE TIME CONTROLLED LIGHT EMITTING DEVICES

BACKGROUND OF THE INVENTION

1. Field of the Invention

The present invention relates to a light emitting diode capable of arbitrarily controlling the delay times of light pulses it emits in response to input voltage pulses and the widths of emitted rectangular light pulses.

2. Description of the Prior Art

When a voltage is applied across a light emitting diode, the current flowing into the diode is at first consumed by charging the junction capacity of the diode. After the junction capacity has been sufficiently charged and when the input voltage has reached the rise voltage or threshold voltage $V\phi$, minority carriers are injected from the $p$ (or $n$) region into the $n$ (or $p$) region of the diode passing over the junction and recombine with majority carriers to emit light. In the case of the direct energy band gap type compound semiconductor such as GaAs and GaAsP, the recombination time is short, for example $10^{-9}$ sec. or less. The rise characteristic of the light emission of the diode is determined by the capacity and resistance of the diode.

As a high speed light pulse generating element an element made of, for example, silicon, gallium phosfide, or the like has been proposed which utilizes the electron avalanche characteristics and is made such that the influence of the junction capacitance on the diode is reduced by making the junction area small. However, it is very difficult to arbitrarily adjust the light emitting area or junction area. Moreover, the structure of the diode is necessarily restricted to a great extent. Consequently, it is very difficult to fabricate a high speed light emitting element having a large light emitting area or junction area and to control the delay time of light emission.

SUMMARY OF THE INVENTION

An object of the present invention is to provide a high speed light emitting diode capable of arbitrarily controlling the delay time of light emission and having a large junction area.

Another object of the present invention is to provide a light emitting diode capable of arbitrarily controlling the width of emitted light pulses without varying the pulse width of a power source.

In short, according to the present invention the junction capacity of a light emitting diode is charged beforehand to an arbitrary value lower than the rise or threshold voltage by applying a D.C. bias voltage thereto, and a pulse voltage is applied thereto in superposed relationship with the previously applied D.C. bias voltage. Thus, the time necessary for charging the junction capacity of the diode to the threshold voltage is reduced. Moreover, by applying a positive or negative bias voltage of an arbitrary value to the diode, the delay time of light emission can be arbitrarily selected. Consequently, not only light pulses having an arbitrary delay time can be generated, but also light pulses having an arbitrary pulse width can be produced.

DESCRIPTION OF THE PREFERRED EMBODIMENT

Figure 1:
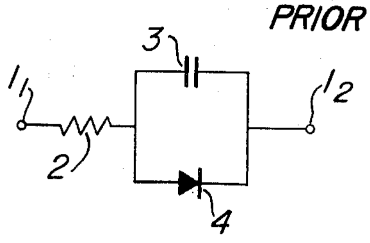
FIG. 1 PRIOR ART
FIG. 1 is an electrically equivalent circuit diagram of a conventional light emitting diode.
Figures 2A, 2B, 2C:
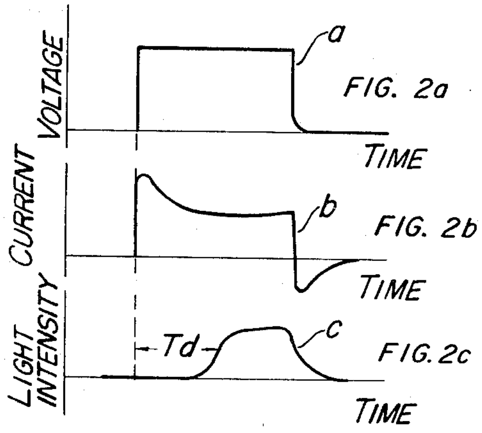
FIGS. 2*a* through 2*c* are diagrams of the time characteristics of a voltage applied to and the current and light intensity produced in a conventional light emitting diode.

Generally, an electrically equivalent circuit of a conventional diode having a $p$–$n$ junction therein is expressed as in FIG. 1 in which reference numerals $1_1$, $1_2$, 2, 3 and 4 designate an input terminal, output terminal electric resistance (the value of which is represented by $R$), junction capacitance, and current passing through the $p$–$n$ junction, respectively. The variations in the voltage applied to and the current and intensity of light produced in the light emitting diode of FIG. 1 with respect to time are shown in FIG. 2. If a rectangular voltage as represented by the curve $a$ in FIG. 2 is applied to the light emitting diode, a current flowing into the diode as a result of the application of the voltage as represented by the curve $b$ in FIG. 2 is at first consumed by charging the junction capacitance 3 (the value of which is represented by $C$). Then the time constant $T_d$ of this process is given by:

$$T_d = RC$$

After the time $T_d$ has elapsed and the junction capacity is sufficiently charged so that the input voltage approaches the threshold voltage, the injection of minority carriers from the $p$ (or $n$) region into the $n$ (or $p$) region occurs passing over the $p$–$n$ junction to combine therein with majority carriers to emit light as represented by the curve $c$ in FIG. 2.

Figure 3:
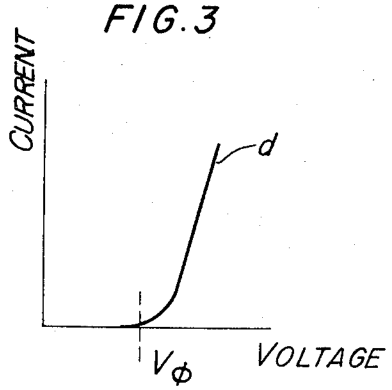
FIG. 3 is a diagram showing the current versus voltage characteristic of a light emitting diode according to the present invention.

According to the present invention, the junction capacity is charged beforehand to an arbitrary level on the current versus voltage characteristic curve $d$ in FIG. 3 lower than the threshold voltage $V\phi$ by having applied a D.C. bias voltage thereto in order to reduce the delay time of light emission $T_d$ in FIG. 2.

Figure 4:
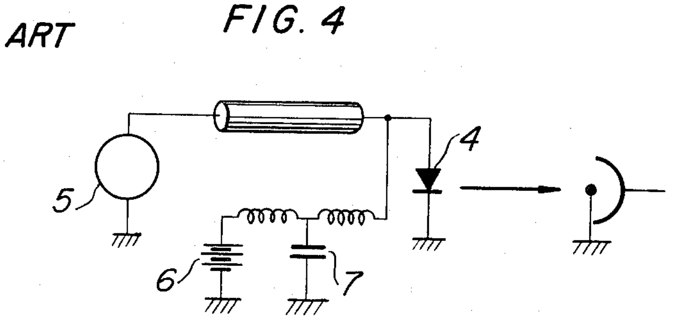
FIG. 4 is an electrically equivalent circuit diagram of a light emitting diode circuit according to the present invention.
Figures 5A, 5B:
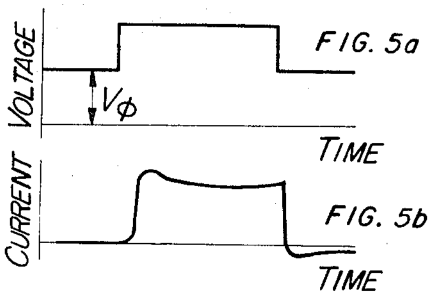
FIGS. 5(*a*) and 5(*b*) are diagrams showing the voltage and current characteristics with respect to the time of the light emitting diode shown in FIG. 4.
Figure 6:
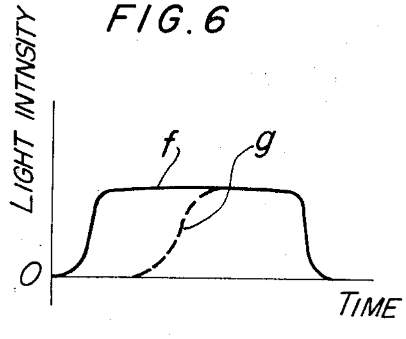
FIG. 6 is a diagram showing a comparison of the delay properties of light pulses emitted by the light emitting diode shown in FIG. 4 and a conventional light emitting diode after the application of a pulse voltage.

Referring now to FIG. 4, a voltage (0.8 to 1.0 volt) which is at most equal to the threshold voltage $V\phi$ of light emission by a light emitting diode 4 made of such as GaAs, $GaAs_{0.6}P_{0.4}$ or $GaAl_{0.4}As_{0.6}$ is applied from a D.C. power source 6 to the diode 4 with a parallel connection of a low pass filter 7. Then a pulse voltage from a pulse generator 5 is applied across the light emitting diode 4. Since the low pass filter 7 has sufficient cut-off frequencies for the pulse voltage, the terminal voltage $V_{ac}$ of the diode 4 shows a voltage versus time characteristic as shown in FIG. 5(*a*), and the current is hardly influenced by the junction capacitance as shown in FIG. 5(*b*). For example, when a D.C. bias voltage of 1.39 volt is applied to the diode 4, the delay time characteristic of light emission by the diode 4 is as shown by *f* (delay time: 3.9 ns) in FIG. 6, and when no bias is applied thereto, the delay time characteristic is as shown by *g* (delay time: 18.5 ns) in FIG. 6.

The delay time or duration of light emission of a light emitting diode made of GaAsP can be controlled over the range of 4 to 50 ns by selecting the value (+1.2 to −5 volts) of the previously applied D.C. bias voltage.

We claim:

1. A time lag or response time controlled light emitting device comprising a light emitting diode, control means for variably controlling the response time of said diode, and drive means connected to said diode along with said control means for applying to said diode drive pulses which will increase the voltage on said diode beyond its light emitting threshold, so that light will be emitted by said diode in response to said drive pulses with a delay determined by said control means.

2. A device as defined in claim 1 wherein said control means includes means for applying to said diode a forward or backward variable DC bias voltage not higher than the threshold voltage for light emission of said diode, and wherein said drive means produces drive pulses having a level which exceeds the difference between said bias voltage and said light emitting threshold voltage of said diode.

3. A device according to claim 2 in which said variable DC bias voltage is variable over a range from +1.2 volts to −5.0 volts.

4. A method of controlling the time lag or response time of light emission from a light emitting diode, comprising the steps of applying a variable DC bias voltage not higher than the threshold voltage for light emission of said diode in a backward or forward direction to said diode, applying to said diode a pulse voltage having a level higher than the algebraic difference between the threshold voltage for light emission of said diode and the level of said bias voltage, and varying said bias voltage thereby controlling the time lag of emission by said diode from the time of application of said pulse voltage.

5. A method according to claim 4 in which said variable DC bias voltage is varied over the range from +1.2 volts to −5.0 volts.

* * * * *